United States Patent [19]

Wu

[11] Patent Number: 5,781,446
[45] Date of Patent: Jul. 14, 1998

US005781446A

[54] SYSTEM AND METHOD FOR MULTI-CONSTRAINT DOMAIN ELECTRONIC SYSTEM DESIGN MAPPING

[75] Inventor: Tom J. Wu, Del Mar, Calif.

[73] Assignee: Flexible Solutions, Inc., San Diego, Calif.

[21] Appl. No.: 648,302

[22] Filed: May 7, 1996

[51] Int. Cl.[6] .................................................. G06F 17/50
[52] U.S. Cl. ................................... 364/489; 364/491
[58] Field of Search ................................. 364/488, 489, 364/490, 491

[56] References Cited

U.S. PATENT DOCUMENTS

| | | | |
|---|---|---|---|
| 4,115,003 | 9/1978 | Nachtrieb | 355/133 |
| 4,768,154 | 8/1988 | Sliwkowski et al. | 364/468 |
| 4,991,115 | 2/1991 | Guthrie et al. | 364/520 |
| 5,019,970 | 5/1991 | Yamaguchi et al. | 364/200 |
| 5,028,866 | 7/1991 | Wiese | 324/158 F |
| 5,062,054 | 10/1991 | Kawakami et al. | 364/491 |
| 5,109,479 | 4/1992 | Wiliams | 395/125 |
| 5,160,842 | 11/1992 | Johnson | 250/338.1 |
| 5,297,053 | 3/1994 | Pease et al. | 364/474.24 |
| 5,299,268 | 3/1994 | Amir | 382/8 |
| 5,392,222 | 2/1995 | Noble | 364/490 |
| 5,440,651 | 8/1995 | Martin | 382/156 |

OTHER PUBLICATIONS

Lin, et al., *Performance–Driven Constructive Placement*, 27th ACM/IEEE Design Automation Conference®, Paper 6.4/103, ©1990.

Preas, Bryan T., *Automatic Placement A Review of Current Techniques*, 23rd Design Automation Conference, Paper 35.1/622, ©1986 IEEE.

Tada, et al., *Router System For Printed Wiring Boards Of Very High–Speed, Very Large–Scale Computers*, 23rd Design automation Conference, Paper 44.1/791, ©1986.

*Primary Examiner*—Emanuel T. Voeltz
*Assistant Examiner*—Leigh Marie Garbowski
*Attorney, Agent, or Firm*—Christie, Parker & Hale, LLP

[57] ABSTRACT

Visualization of how multiple constraints may effect design implementation choices and characterization of design spaces is provided by a system for computer aided design of a higher level electronic system which is itself constructed from lower level entities. A plurality of violation free regions is defined, with each region being determined by a particular entity-to-entity spacing rule or rule set. The multiplicity of violation free regions define ranges of valid position placements for entities within a particular constraint domain. Multiple constraint domains are handled by defining additional violation free regions which determine ranges of valid position placements for entities which satisfy the various additional constraint domains. The various violation free regions are logically combined to define a resulting violation free volume in which a component may be placed which will satisfy the constraints of all of the constraint domains whose violation free regions have been logically combined.

20 Claims, 8 Drawing Sheets

SYSTEM AND METHOD FOR MULTI-CONSTRAINT DOMAIN ELECTRONIC SYSTEM DESIGN MAPPING

FIELD OF THE INVENTION

The invention relates to a system and method for computer aided electronic system design in a multi-constraint domain environment. In particular, the invention relates to the characterization of a multi-constraint design space in a digital format suitable for use by an automatic multi-constraint driven optimization routine.

BACKGROUND OF THE INVENTION

Electronic system design requires both the construction of the device having a particular behavior or performing a specific function, and doing so in a manner which meets or optimizes a set of pre-determined design constraints such as cost, performance, power consumption, operating temperature, reliability and ease of manufacture. Often, the difficulties in meeting these externally imposed constraints can far outweigh the difficulty of designing in the proper functional behavior. The degree of success in optimally meeting such constraints is almost always the real criteria for successful product development since in any competitive business environment, many devices performing substantially identical functions will exist.

Heuristics and models, which allow estimates or even generally accurate modeling, of the behavior of a particular device or entity within a particular constraint domain are well known in the art. Typically, these heuristics and models are used in conjunction with design rule checking software and operate on a single entity at such time as the entity is positioned or after a design decision has been made with respect to that entity. Various algorithmic processing techniques are commercially available to accomplish this function, but most of these commercially available techniques relate to defining conductor or interconnect patterns provided between points to be wired together. In order to ensure that certain wiring criteria are met, these automated routing systems will operate according to an interconnect protocol which specifies certain constraints placed upon conductor patterns provided between points. These protocols may be global (relating to the entire printed circuit board) or vary with each set of points to be interconnected.

More recently, collections of heuristics and models, conventionally termed design advisors, have been developed which allow an engineer to estimate how a particular entity will behave under a certain predefined characteristic pattern. By varying a single characteristic, while holding other characteristics constant, an engineer is able to develop a set of design alternatives which may be used to "home in" on a particular design solution. However, the engineer may well overlook the optimal solution within the mass of data accumulated, or may even fail to find the design alternative which actually meets all of the design constraints.

Existing commercially available optimization tools typically operate serially on constraint domains (operate on a single domain at a time). Specialized techniques, such as simulated annealing, have been proposed, specifically to handle optimization of positional constraints in one or two domains. However, simulated annealing requires the initial placement of an entire system population to function properly and operates by making iterative changes within the population and comparing each iteration's error score. Simulated annealing is, therefore, highly dependent upon the vagaries of random choice and stochastic variability in its definition of an optimum solution. Indeed, the very nature of simulated annealing is such that infinite time is required in order to reach a global optimum.

Accordingly, conventional system designers, whether using the simulated annealing technique, the Lee's maze auto routing algorithm, or other conventional computer aided design techniques, must at some point take over the task of manually completing various aspects of the system design.

Furthermore, there is no methodology available for mapping and portraying the effect of multiple constraints expressed in multiple domains in an automated system. Also, there is no methodology available which allows a design space for a composite entity (such as a package made up of multiple pins, casing, etc.) to be automatically constructed from the individual entities comprising it, nor any methodology for evaluating design alternatives in an automatic or semi-automatic mode.

BRIEF SUMMARY OF THE INVENTION

In accordance with practice of principles of the present invention, visualization of how multiple constraints may effect design implementation choices and characterization of design spaces in a digital format suitable for use by an automatic multi-constraint driven optimization routine is provided by a system according to the invention for computer aided design of higher level electronic system, of the type exemplified by a printed circuit board, which is itself constructed of a multiplicity of lower level components. The relative placement positions of each of the lower level components are limited by a multiplicity of dissimilar design constraints, the combination of which define an n-dimensional constraint domain.

In one aspect of the invention, a multiplicity of input indicious sets, each indicious set representing a particular component-to-component layout spacing rule or rule set is provided as an input to the expert system comprising the invention. Each input indicious set defines the protocols from which a design space is constructed, each design space comprising violation free regions defining those areas in which a component may be placed without violating its corresponding component-to-component spacing rule or rules. In accord with the present invention, a first violation free region defines a range of valid position placements for a component which satisfies the protocol set of a first constraint domain. The violation free region maps an available design space for the component in that constraint domain. Additional violation free regions define ranges of valid position placements for a component which satisfies additional protocol sets of additional constraint domains, the associated violation free regions mapping available design spaces for the component in those constraint domains.

In an additional aspect, the system of the present invention is implemented as a computer software program wherein the violation free regions, for each constraint domain, are expressed as polygons, the areas enclosed thereby defining the range of valid position placements for a component in the respective constraint domain.

In yet a further aspect, a system in accord with the invention includes means to logically combine various violation free regions to define thereby a resulting violation free volume in which a component may be placed, the violation free volume representing a component placement design space within which a component will satisfy the constraints of all of the constraint domains whose violation free regions have been logically combined. In particular, such logical

3 combination may be performed in accordance with a logical AND operation, a logical OR operation, or displayed on a graphics output screen as a logical union of two or more violation free regions.

A look-ahead feature is provided in accord with the invention which allows the system designer to explore various design alternatives, and then transform the desired behavior or function into a physical/electronic implementation so as to best meet design constraints while maintaining the original desired behavior. In accordance with the invention, constraints may comprise (but are not limited to) signal propagation delays, device temperatures, power dissipation, noise, cost, manufacturability, testability, size, weight, routability, and the like. Constraints may be either externally supplied or can be derived, such as by using timing analysis on a digital circuit to derive signal delays necessary to achieve a certain performance.

Because the system provides a means of accommodating electronic system design within a multi-constraint domain, it may be utilized to process an entire higher level electronic system design, or a significant portion thereof, in a manner that will result in generally maximizing performance while simultaneously generally minimizing cost and time.

BRIEF DESCRIPTION OF THE DRAWINGS

These and other features, aspects and advantages of the present invention will be more fully appreciated when considered with the following detailed description, appended claims and accompanying drawings wherein:

4

DETAILED DESCRIPTION

Figure 1:
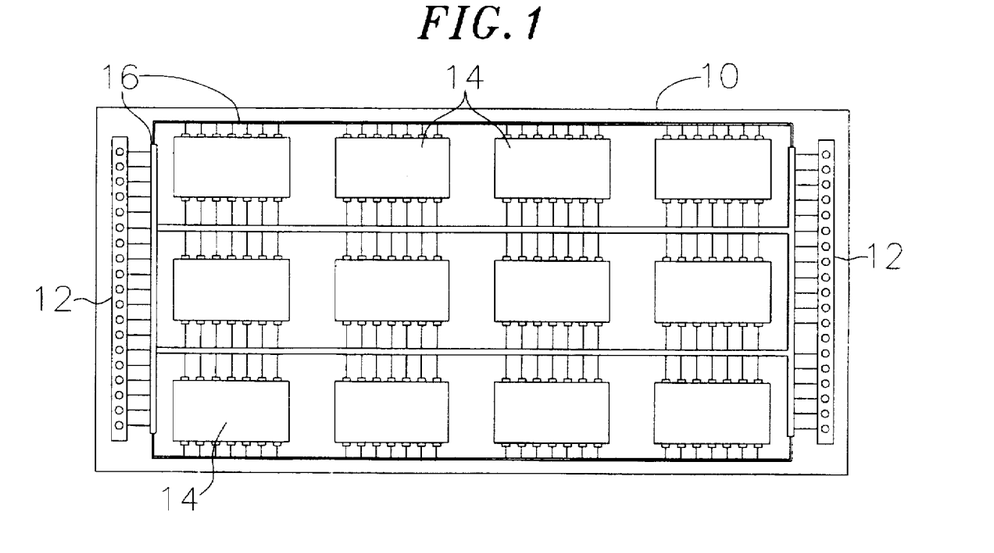
FIG. 1 is a semi-schematic plan view of a printed circuit board populated with 12 exemplary components.

With respect to FIG. 1, there is shown a semi-schematic plan view of a printed circuit board, indicated generally at 10, of the type adapted to communicate with other components of a higher level electronic system by means of electrical connections made through input/output (I/O) connectors 12. The board 10 further includes a plurality of electronic components 14 (in the embodiment of FIG. 1, twelve components are shown) electrically interconnected by horizontally and vertically running conductive lands 16 disposed in routing channels provided between the components 14. The printed circuit board 10 may be any one of a variety of conventional single-layer or multi-layer boards, and, according to convention, the conductors 16 may be disposed on the surface of the board or on adjacent interior layers, at the option of the designer.

In particular, the layout of the components 14 on the printed circuit board 10 are typically driven by the number and nature of connectors 12 required to connect the board to a higher level electronic system. Because of constraints imposed by such higher level systems, the number, location, and function of the connectors 12 are often predetermined and impose a first, and often immutable, physical position constraint on the board designer. The location and arrangement of the electronic components 14, however, offer the board designer a degree of flexibility not allowed by the positioning of the connectors, but often impose other, difficult to reconcile, constraints.

In the exemplary printed circuit board of FIG. 1, twelve electronic components 14 have been placed on the printed circuit board 10 in a regular rectangular array which minimizes the overall area of the final printed circuit board and, thus, minimizes its footprint in a higher level electronic system. Conventionally, each component is initially placed in an arbitrary location on the board, and a physical spacing design rule check (DRC) is performed to verify that there is adequate spacing between adjacent components to accommodate conductor routing channels or the handling head of a pick-and-place PCB manufacturing system.

Once the components are placed, they are interconnected by use of a conventional computer-hosted automatic routing algorithm exemplified by the Lee's maze routing algorithm available as an adjunct to various computer-automated design systems. Following automatic routing, the board designer must then evaluate the completed system electrically and manually compensate for electrical design rule violations, thermal design rule violations, and critical timing path violations. Each evaluation results in manually interposing various of the components 14 to attempt to alleviate the various physical and electrical design rule violations. Following reshuffling of the components, the interconnect wiring must be rerouted, and the resulting system again evaluated for electrical design rule violations. Developing a multi-component system may be thus seen as involving an iterative process which continues until the designer feels that there is little additional optimization that can be realized through successive iterations. The system design is then finalized with whatever remaining inherent faults it may contain.

In accordance with practice of the present invention, each constraint domain of an n-domain set is expressed as a pattern, exemplified by a polygon or polygons, which are in turn informed and defined by each constraint domain's particular design rules. The polygons comprising individual constraint domains are logically processed in accord with the invention by a computer or CAD system to construct a three-dimensional map of constraint domain overlays. In one dimension, a polygon can be described which encloses the area which meets any particular constraint, with the area satisfying the constraint being refereed to as a free-of-violation region (hereinafter called the "FVR"). The shape of the polygon depends on the final system's design characteristics (for instance, whether interconnect routing is horizontal, vertical, or all-angle) and can be rectangular, octagonal, circular, or irregular in shape. For multi-constraint domains, the area meeting the multiple constraints can be described as a polyhedron which encloses an FVR volume.

Figure 2:
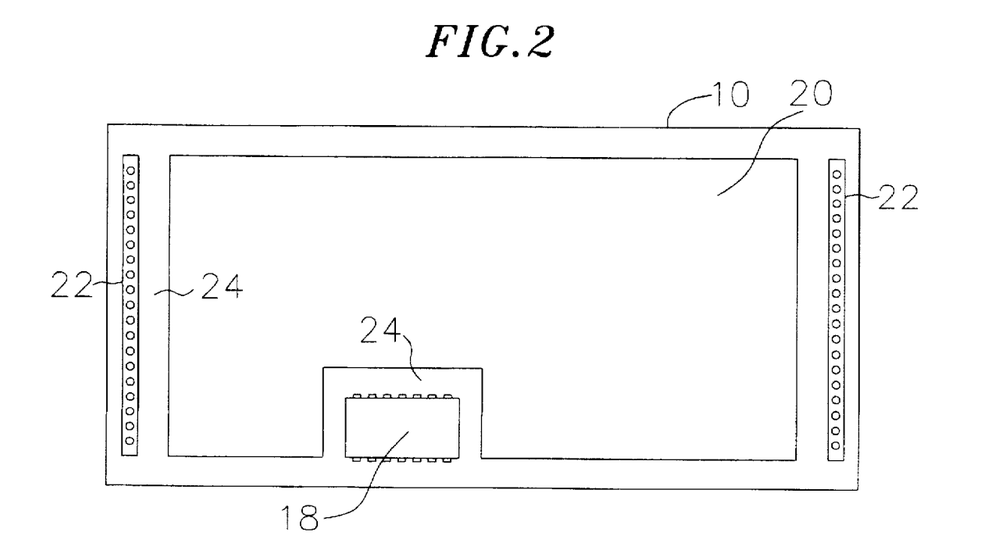
FIG. 2 is a semi-schematic plan view of a printed circuit board depicting an exemplary component and the resulting spacing design rule free-from-violation region.

Turning now to FIG. 2, there is shown a semi-schematic plan view depicting an exemplary printed circuit board 10 including an exemplary component 18, which is arbitrarily placed on the surface of the board, and a resulting heuristically determined physical placement FVR 20. The FVR 20 represents that portion of the surface of the board 10 on which any next component may be placed without violating the, for example, physical spacing design rule requirements of the system. Indeed, the physical placement FVR is defined by, and constructed from, physical placement design rules which form one set of inputs to the expert system. In particular, the shape of the physical placement FVR 20 is determined by the placement of initial components, such as connectors 22, and the initially placed component 18. It will be noted in the example of FIG. 2 that the physical placement FVR 20 is pulled away from the I/O connectors 22 and the first-placed component 18 to thereby define violation regions 24. The violation regions 24 might result from, for example, a design rule spacing requirement imposed by the physical dimensions of a handling head of an automatic pick-and-place component insertion system. The violation regions 24 define those regions in which, if a component were positioned therein, it would be difficult, if not impossible, for an automatic placement system to "stuff" the board correctly.

In addition, the spacing rules may be further expanded to account for components of different height, different package designs (pin-grid arrays, DIPs, SMCS, or cans), or spacing required by thermal floorplanning.

In accordance with the invention, once an FVR is defined, the design system may be commanded by an appropriate user input to enforce a next-placed component's location to be within the FVR. Likewise, when such an enforce command is invoked, the system will only allow motion within an FVR or between FVRs in a manner similar to a snap-to-grid constraint in a graphics or drafting program. Additionally, in a manner to be described in greater detail below, the FVR for each constraint domain is dynamically reconfigured by each sequential component placement.

Figure 3:
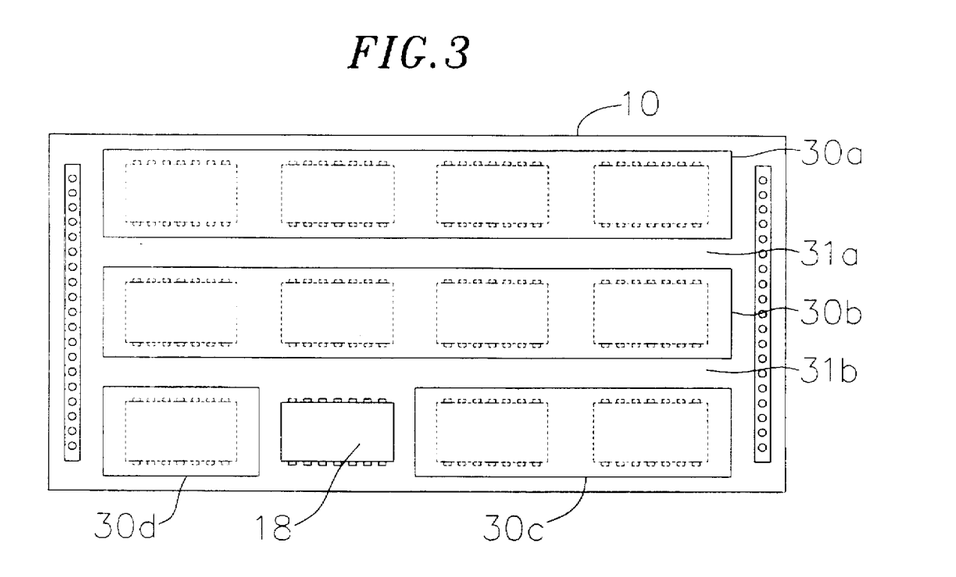
FIG. 3 is a semi-schematic plan view of a printed circuit board depicting an exemplary component and the resulting spacing rule free-from-violation regions developed by a look-ahead function in accordance with the invention.

Turning now to FIG. 3, there is depicted a semi-schematic plan view of a printed circuit board design 10 depicting an exemplary component 18 which is arbitrarily placed on the surface of the board, and the resulting FVR regions developed by a look-ahead function in accordance with the present invention. In the embodiment of FIG. 3, four separate FVR regions 30a, 30b, 30c and 30d are depicted which represent the results of a particular, arbitrary placement of any preceding component (such as the first-placed component 18) on future placements. In particular, from FIG. 3 the system of the invention recognizes that placement of a component will have implications for placement of neighboring components. For example, placing first component 18 defines an FVR polygon 30a, along which other similar-sized components may be placed. Neighbor-to-neighbor component spacing rules, define a second FVR 30b, separated from FVR 30a by the design rule defined spacing distance 31a. The width of FVR 30b is defined in turn by a design component polygon and is separated from a next FVR 30c by the design rule defined spacing distance 31b. The design component polygon defining the width of each FVR may be taken from the design component polygon of a first-placed component (such as component 18) and arbitrarily propagated, or a user may, at his option, input the design component polygons of all of the components desired to be placed on the board and allow the system to calculate the FVR areas with a least-area heuristic consistent with the design spacing rules and the overall physical dimensions of the board.

In accordance with the invention, the look-ahead FVR generator performs dynamically, i.e., the least-area FVR polygon generator is able to base its calculations on the initial placement of a first component. Subsequent component placement may radically alter the shapes of the initially generated FVR polygons, as would be the case where a greatly oversized component, with a larger than nominal design component polygon value, is positioned after a preceding, smaller component.

Figure 4:
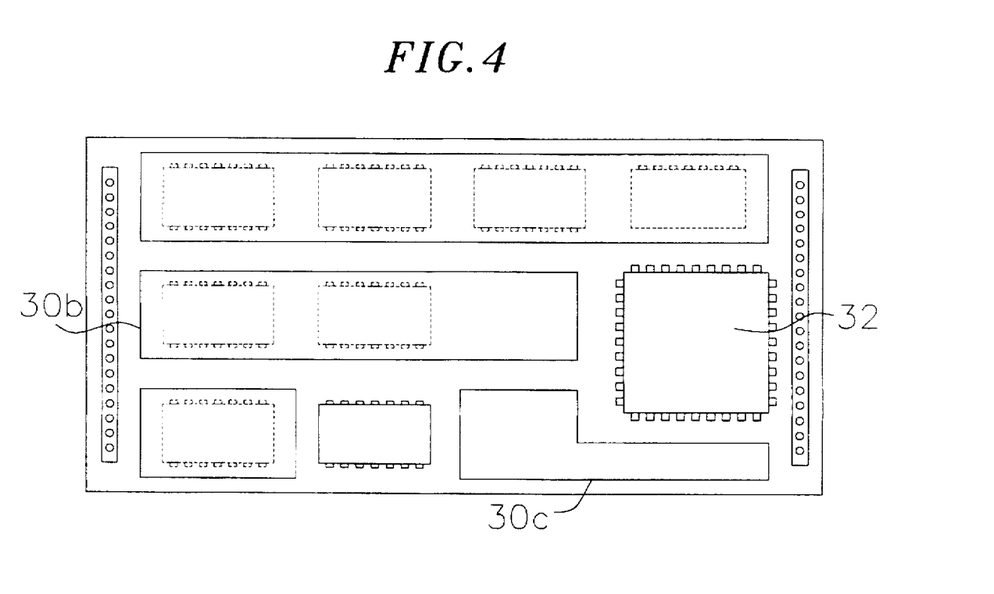
FIG. 4 is a semi-schematic plan view of a printed circuit board depicting the resulting spacing rule free-from-violation regions developed by an initially placed component and a subsequently placed over-sized component.

The above-described case is depicted in FIG. 4, wherein the initial FVR regions 30b, and 30c, defined by placement of component 18 (shown in FIG. 3), are truncated by placement of an oversized component 32, such as a microprocessor or other similar large-scale integrated circuit.

In accordance with practice of principles of the present invention, FVRs are developed for other constraints within the constraint domain set in a manner similar to those developed by application of physical spacing design rules. In particular, an FVR or FVRs may be developed by application of component critical timing path rules.

Figure 5:
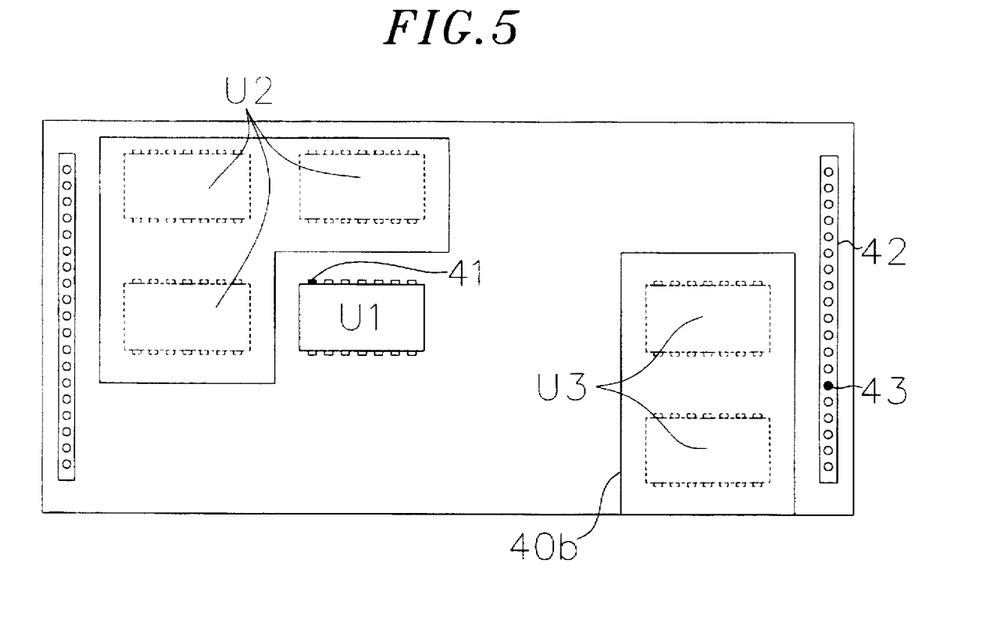
FIG. 5 is a semi-schematic plan view of a printed circuit board depicting the resulting free-from-violation regions developed by application of component critical timing path rules.

Turning now to FIG. 5, there is depicted a set of exemplary FVRs 40 developed by various critical timing path requirements relating to components U1, U2, and U3. In particular, component U1 may have a specific timing requirement on, for example, a particular pin 41, which requires the signal sourcing component (for example, U2, depicted in phantom,) to be placed within a specific area 40a, such that the interconnect wiring between the two components is short enough that the RC components of the wiring do not degrade the signal. Likewise, FVR 40b represents the area in which a component U3 (whose potential placement options are likewise depicted in phantom) may be placed in order to satisfy the critical timing constraints of a signal sourced by a particular pin 43 of the I/O connector 42.

Figure 6:
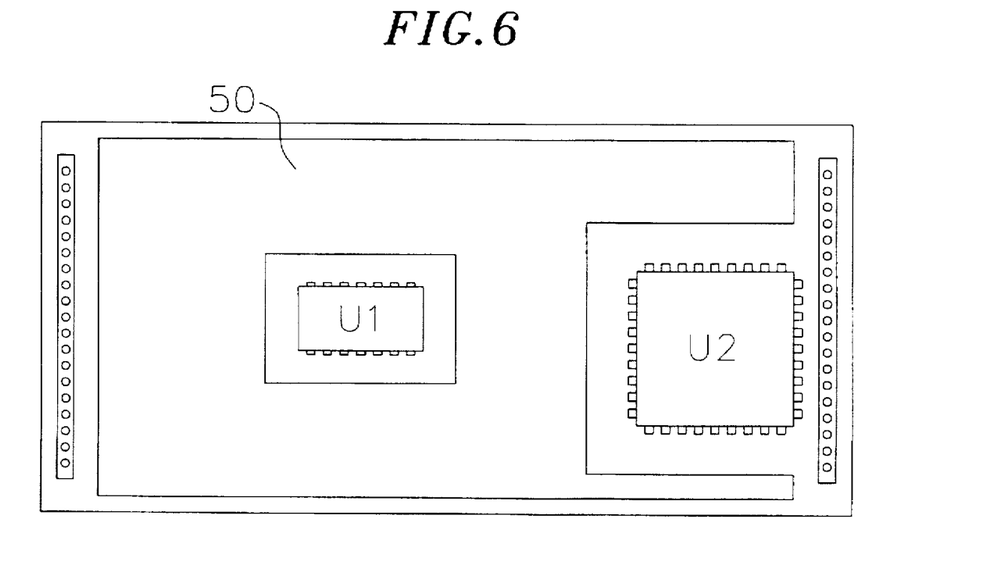
FIG. 6 is a semi-schematic plan view of a printed circuit board depicting the resulting free-from-violation regions developed by application of thermal floorplanning rule.

In FIG. 6, there is depicted a semi-schematic plan view of FVRs developed by application of thermal floorplanning rules with regard to two exemplary components U1, and U2. Thermal rules are easily accommodated in the system of the present invention by inputting commercially available power and thermal dissipation values which are characterized with respect to the various package types in which integrated circuits are marketed. The thermal FVRs 50 ensure that sufficient spacing is provided adjacent a component (U1 for example) with a high degree of thermal dissipation in order to avoid a local "hot spot" on the resulting printed circuit board which would degrade the board's performance. In addition, placing two components with high thermal dissipation adjacent one another, with insufficient spacing between them, would pose severe reliability problems for the resulting board and may conceivably locally heat the board enough to cause physical damage.

In accordance with practice of principles of the present invention, FVRs may be generated for any number of design constraints for which a DRC or a net list is available as an input to the system. Constraint domains that may be addressed by the system of the present invention, and for which FVRs may be generated, include but are not limited to interconnect delays and skews, physical device constraints (clearances and heights), thermal constraints (device temperatures and reliability), EMI emissions and signal noise, design for testability, design for assembly and manufacturability (insertion clearance, device orientation, and inspectability), routability (number of wiring layers and channel density) and the like. The methodology of the present invention can be applied in any design step where decisions involving multiple constraints are made. For example, early design tradeoffs, such as cost/performance and physical attributes/time-to-market, may be evaluated with the system, as well as packaging and subsystem partitioning, and device, module, subsystem or entire system interconnection.

Figure 7:
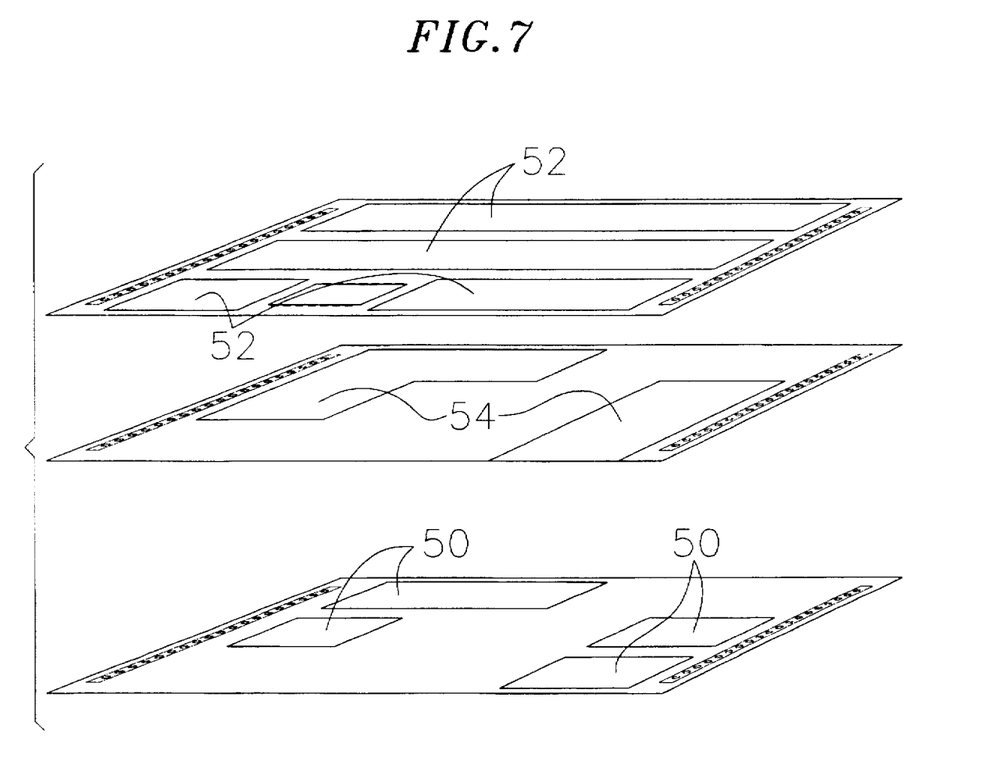
FIG. 7 is a semi-schematic plan view of a printed circuit board depicting the resulting free-from-violation volumes developed by overlaying the spacing FVRs of FIG. 3 and the timing FVRs of FIG. 5.

The utility of the present invention, in particular the utility of the look-ahead function in evaluating various component placement and design alternatives will now be described in connection with FIGS. 7 and 8. In FIG. 7, there is depicted a semi-schematic plan view of a printed circuit board including the resulting free-from-violation regions 50 developed by overlaying the spacing FVRs 52 of FIG. 3 and the timing FVRs 54 of FIG. 5. The overlay FVR map of FIG. 7 may be generated by a computer aided design program, which may initially define the individual FVRs of a specific constraint domain and subsequently combine the single constraint domain polygons into a desired multi-constraint domain FVR region by a logical AND operation. Thus, the resulting multi-constraint domain FVR 50 region represents only those areas in which a component may be placed that satisfies both the physical spacing constraints of the physical spacing constraint domain 52 AND the physical spacing constraints of the thermal floorplan constraint domain 54.

Figure 8:
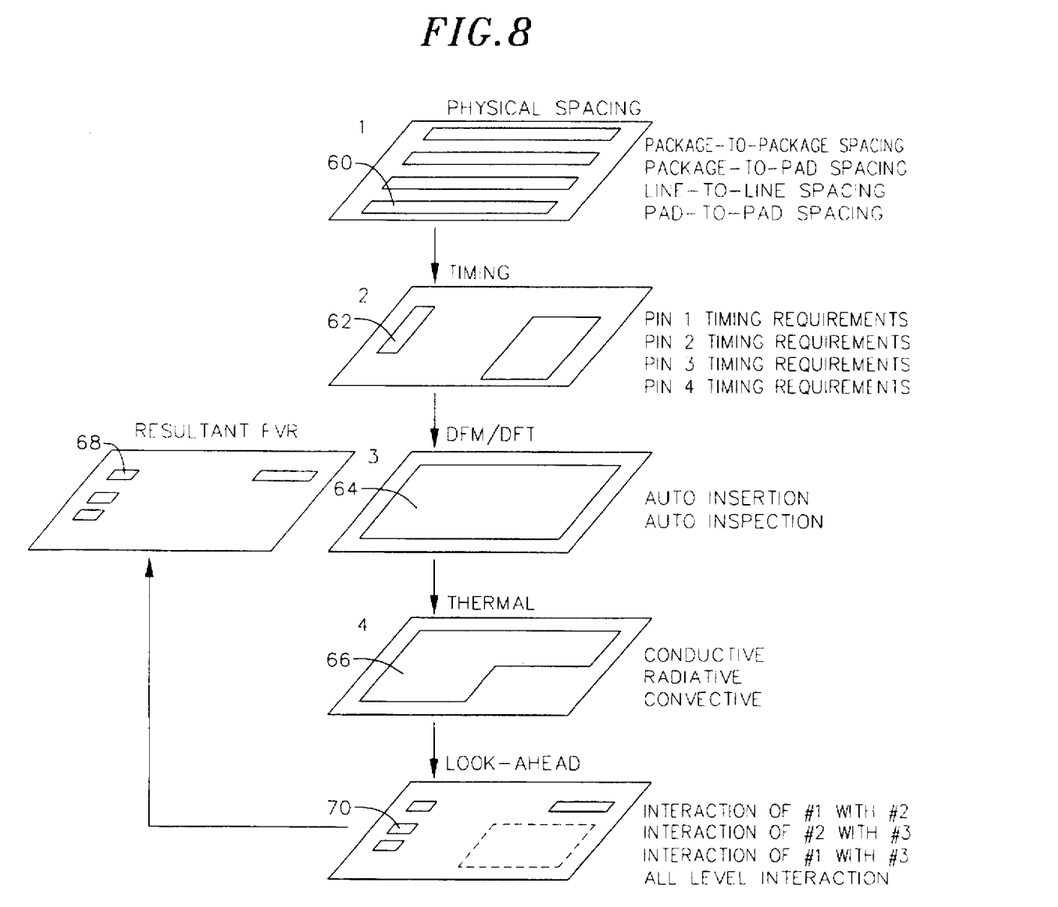
FIG. 8 is a semi-schematic plan view of a plurality of FVRs representing multiple constraint domains overlaid to define a plurality of design alternatives expressed as look-ahead maps.

Turning now to FIG. 8, there is depicted a semi-schematic plan view of a plurality of FVRs representing multiple constraint domains which are logically overlaid to define a plurality of design alternative look-ahead maps. In FIG. 8, the first, physical spacing FVR polygon set is constructed in accordance with a physical placement design rule package, which sets forth the package to package spacing rules, package to pad line spacing rules, line-to-line and line-to-pad spacing rules, and the like. As will be described in greater detail below, a second, timing FVR polygon set 62 is constructed in accordance with the timing requirements defined for the various connector pins and component pins, as set forth in, for example, a net list. Such a net list is a common, conventional output of a computer hosted automated logic design program. The timing FVR polygon set represents, therefore, the locations in which a particular component may be placed, with respect to a critical timing path, in order that the device function properly electrically.

A third, design for manufacturability/design for testability (DFM/DFT) FVR polygon set 64 defines those locations in which a component may be placed in order to satisfy a hierarchical rule set relating to automatic component insertion, automatic component inspection, and any externally imposed testability requirements placed on the final article. Likewise, a thermal FVR polygon set 66 is defined in which a component may be placed in order to avoid thermal overloads resulting from convective, conductive, or radiative thermal "hot spots".

In accordance with practice of principles of the invention a resultant multi-constraint domain FVR 68 for any particular item is generated by simultaneously satisfying the free-from-violation conditions imposed by each of the individual constraint domains. The resultant multi-constraint FVR 68 for any item may be output from the system in either digital format, defining a polygon or polygon set, or graphically displayed on a computer screen as an aid to the system designer. The resultant FVR map is generated by logically ANDing the polygons defined by the, for example, physical spacing, timing, DFM/DFT, and thermal constraint domains.

Interconnect traces are also able to be accommodated by the system of the present invention, by defining an FVR region for every interconnect trace between two connecting points. In contrast to conventional trace routing architectures, which conventionally search for empty space in which to route an interconnect trace, tentatively lay down the interconnect, and then apply a design rule check to search for violations, the system of the present invention "places" a trace with respect to a valid FVR region, thus defining routability as another constraint domain. As will be apparent to one skilled in the art, a routability constraint domain comprises a plurality of lower level constraints, such as trace orientation (whether horizontal, vertical, or at a 45° angle) the number of interconnect layers, interconnect impedance matching, and the like. As many lower level constraints as desired may be rolled-up into an interconnect trace placement protocol set which defines an interconnect trace placement FVR.

In accordance with practice of principles of the invention, each interconnect trace FVR is updated according to the look ahead feature, with regard to the placement of any new component or entity and its associated interconnect traces. The look ahead update considers the entity space constraint domain, the interconnect trace routability constraint domain, any applicable manufacturability constraint domain, and any additional constraint domain required to be met by the performance or design characteristics of the desired finished product. Accordingly, it will be apparent to those having ordinary skill in the art, that interconnect traces are "placed" in accordance with the present invention, rather than being conventionally "routed". An arbitrary path is selected for each interconnect trace requiring placement, such that the arbitrary path resides entirely within a violation free region. Once this condition is satisfied, it will be apparent that no calls to a design rule check routine are required following placement of an interconnect trace.

An additional feature of the system of the present invention is the ability to function as a "design advisor" by displaying various interaction alternatives for the various items to be placed on the final printed circuit board. In accordance with the present invention, the design advisor is a software subroutine which is able to preview (look-ahead) the interaction of, for example, item number 1, with, for example, item number 4, of a multi-component board, by generating their respective individual FVRs in each of the constraint domains and alternatively placing the components in arbitrary positions, while performing a logical OR on the resultant FVRs with respect to the alternative placements. Multiple design alternatives for any particular entity can, thus, be represented in terms of how those design alternatives ef fect various chosen sets of individual constraint domain overlays. Overlays corresponding to a particular design alternative may be logically processed or ignored, at a user's preference, to determine how a particular placement decision would effect the final design space. The FVRs 70 for a specific set of alternatives are generated by logically combining (AND, union, or the like) each alternative. In addition, the system allows for automatic pruning of design alternatives that result in zero FVRs, either within a single constraint domain or as a result of combining constraint domains.

Constraint conflicts are decomposed by evaluating overlay subsets, i.e., taking different combinations of domains and at a time, or looking for a single domain with zero FVRs, to identify the particular constraint domain causing the problem. As will be understood by those having skill in the art, particularly in connection with critical timing path analysis, decomposition may also be performed with respect to any individual entity, i.e., individual signal delays analyzed with respect to a specific pin or a specific set of pins of a device. Accordingly, the constraint domain FVRs and their logical overlay can be understood as providing means which may be logically combined in any fashion to facilitate resolution of inter or intra domain constraint conflicts.

Application Scenario Analysis

A specific application of the system and method of the present invention will now be described with reference to FIGS. 9, 10 and 11. As mentioned previously, the system and method of the invention is implemented in software which is capable of being ported to a personal computer, a work station, or to a mini/mainframe computer. The particular scenario chosen involves the analysis and definition of an FVR for placement of a component with respect to existing components, whereby the component to be placed must satisfy two critical timing path constraints with regard to the already-located components.

Figure 9:
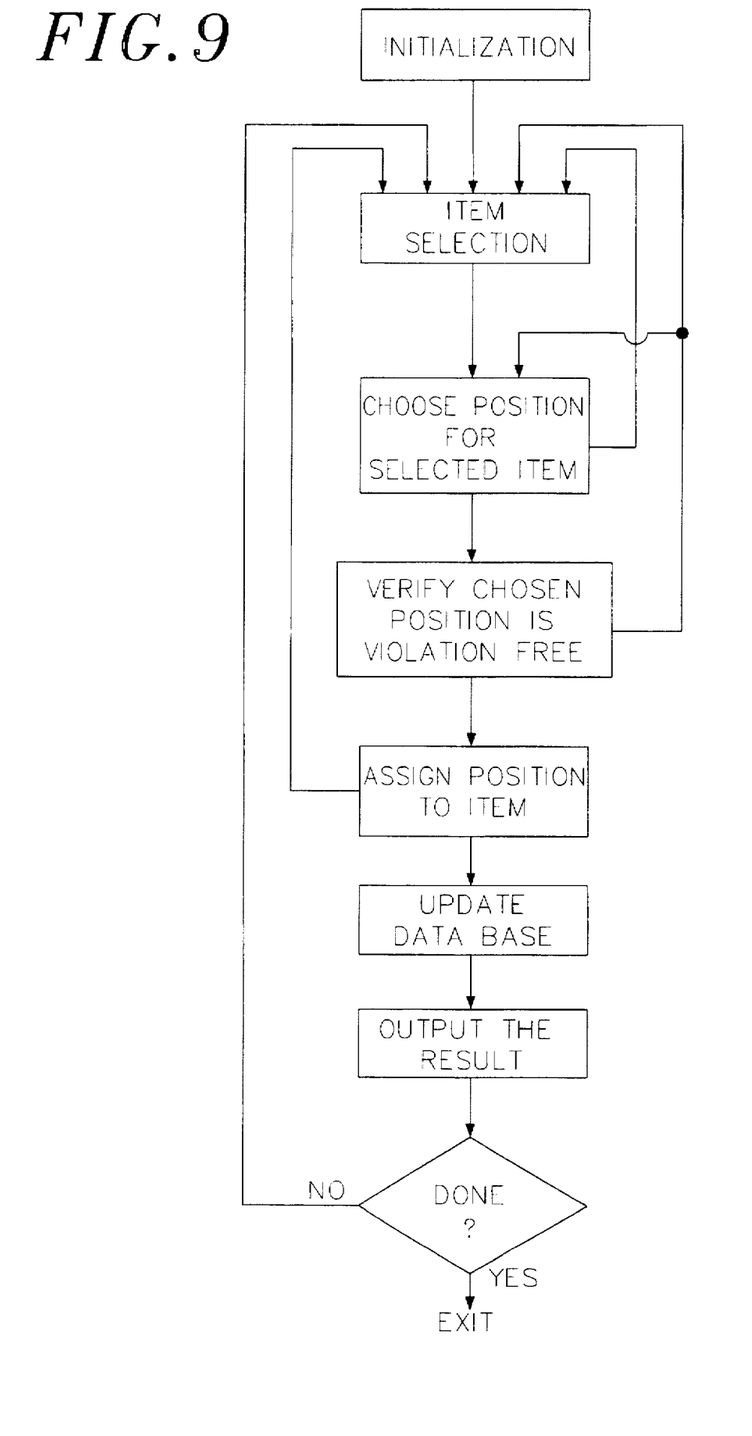
FIG. 9 is a flow chart of a physical layout design cycle performed in accordance with the present invention.
Figure 10:
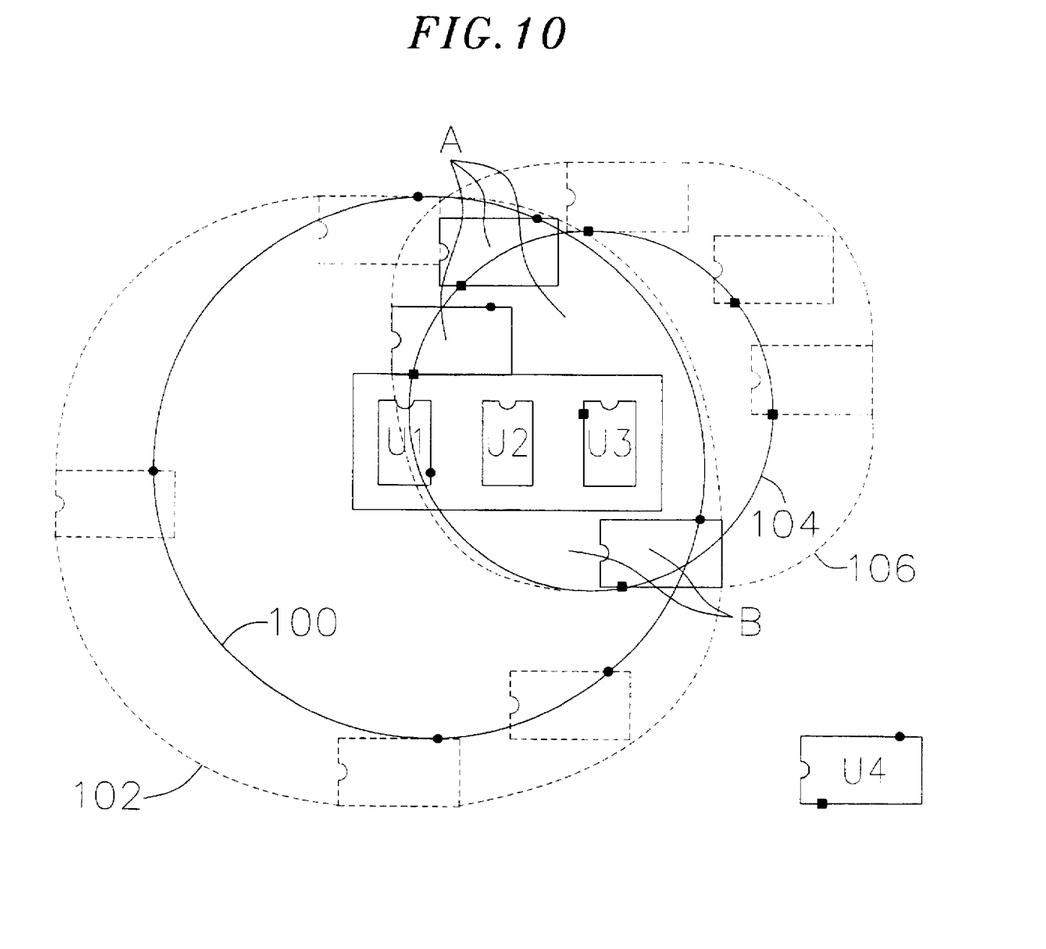
FIG. 10 is a semi-schematic plan view of critical timing path FVRs constructed in accord with the present invention.

As set forth in the flow diagram of an exemplary layout design cycle depicted in FIG. 9, the design system is first initialized during an initialization step to fix in place the already-positioned components, designated as U1, U2, and U3 in FIG. 10. According to the flow diagram, a next item to be positioned is selected, which item may be either a component or a wiring connection pair. Item selection may be performed manually or, alternatively, selection may be automatically made in accordance with a pre-determined hierarchical component list.

Once selected, a position is chosen for the selected item, and the chosen position is evaluated by the system of the present invention to determine whether the chosen position is violation free with respect to the rules of the particular constraint domain chosen.

According to the flow chart of FIG. 9, position verification may be successful, in which case the position is assigned to the item and the design system data base is updated, or the position chosen resides in a violation zone, in which case the designer is prompted to chose an alternative position, or to select an alternative item, if indeed an item is required to reside in the initially chosen position. Item selection, position choice and position verification is, thus, an interrelated and dynamic process. Once acceptable positions are assigned to an item comprising the system, the system data base is updated, and the result is output as a composite system design. The item selection list is then evaluated to see if any further items remain for selection and positioning. After all items are positioned, the date base is finalized, and system design is complete.

Turning now to FIG. 10, the system has been initialized with components U1, U2, and U3 already assigned positions on the final printed circuit board. A next item, U4 is selected for placement because U4 shares critical timing path relationships with both U1 and U3. In accord with the illustrated embodiment of FIG. 10, one of the pins of U4, designated as a solid circle, has a critical timing path relationship with a corresponding pin of U1, also designated as a solid circle.

Additionally, a second pin of U4, denoted as a solid square, has a critical timing path relationship with a corresponding pin of U3, also denoted as a solid filled square.

In order to determine the allowable placement position for U4, the free-from-violation regions (FVRs) must be determined, independently, for each critical timing path between U1 and U4 and between U3 and U4. According to FIG. 10, the signal delays inherent in exemplary interconnect wiring, when evaluated against the timing requirements between U1 and U4 as expressed in an electronic net list, mandate that the pin of interest (the solid circle of U4) reside within an area bounded by a circle 100 centered on the corresponding pin pair (filled circle) of U1. Given the orientation of the critical pin on one side of the U4 component, it may be seen from FIG. 10 that the physical location of the component may be defined within a larger, acircular area 102, which is traced out by the largest dimensional extent of U4, as its critical pin moves along the circumference of its free-from-timing-violation area 100.

However, the second pin (the filled square) of U4 must also satisfy a critical timing relationship with a corresponding pin pair of U3. In this case, the required signal delays are assumed to be much shorter, as indicated by the smaller radius of U3's critical timing violation free circular area 104. In order to meet the critical timing constraints with respect to U3, U4's corresponding pin pair must reside on or within the boundary of U3's free-from-timing violation region 104. In a manner similar to the U4/U1 case, as U4's critical pin is moved along the circumference of U3's free from timing violation area 104, U4's dimensional extend sweeps out a second acircular area 106 which represents the location FVR in which U4 may be placed in order that the timing constraint is satisfied with respect to U3.

Final placement options for U4, which satisfy the critical timing constraints with respect to both U1 and U3, are developed by evaluating the union between U4's 2 individual placement FVRs 102 and 106. U4 may be successfully placed in any location which is completely enclosed by the boundaries of both FVR regions 102 and 106. However, an additional constraint is imposed on the location of U4 because of the physical spacing violation region surrounding the already placed U1, U2, and U3 components. Thus, the final placement FVR for U4 represents a logical ANDing of the individual placement FVRs 102 and 106 combined with a logical NOT of the physical separation FVR described above.

Accordingly, only two general areas remain in which U4 may be positioned, in a manner that satisfies both of the critical timing constraints, as well as the physical spacing limitations. These areas are denoted as A and B in the representation of FIG. 10.

Figure 11:
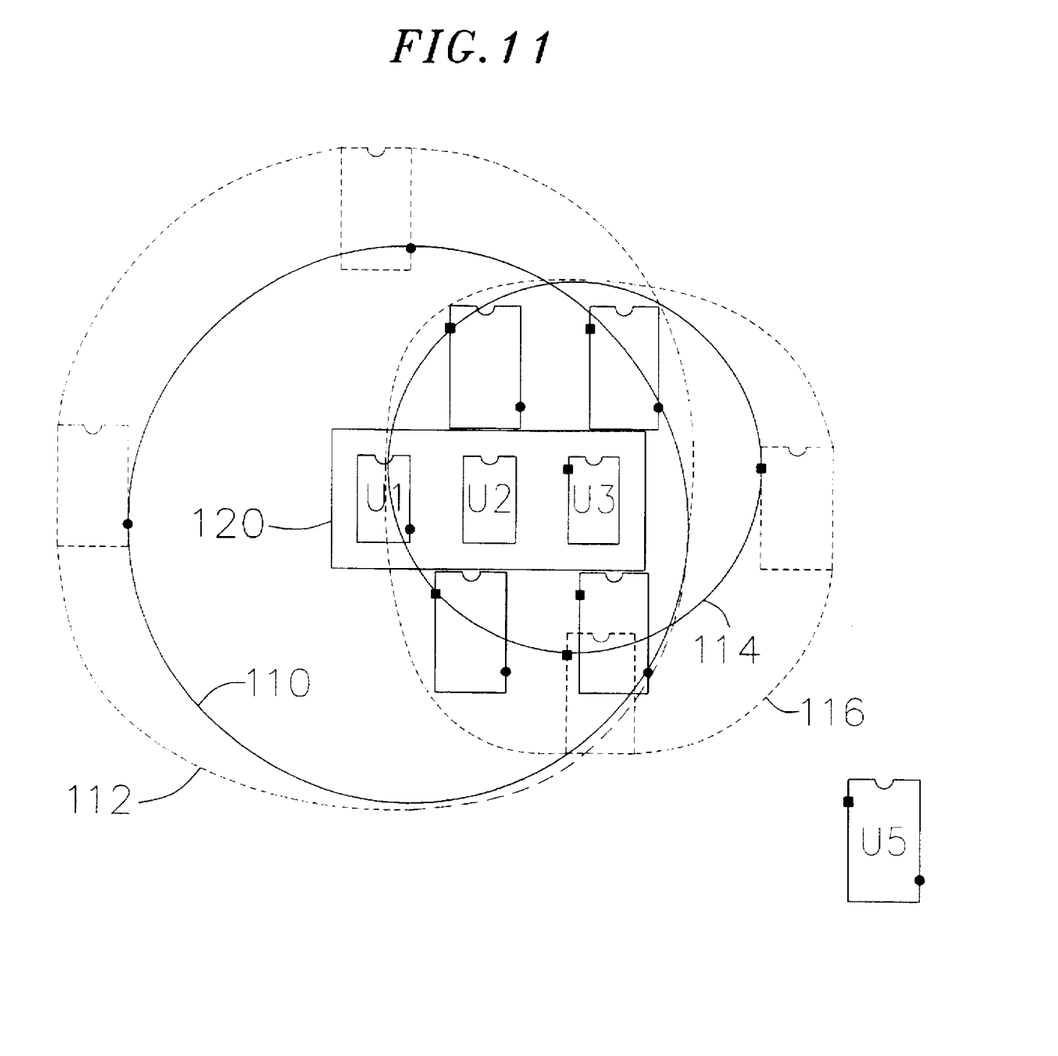
FIG. 11 is a semi-schematic plan view of alternative critical timing path FVRs constructed in accord with the present invention.

Turning now to FIG. 11, a similar evaluation is performed (2 critical timing paths and physical spacing constraints), but with respect to a component, U5, which is oriented 90° from the orientation of U4 in the preceding example. In a manner similar to the preceding example, a critical timing path FVR is defined with respect to a critical pin of U1 and represented as an area bounded by a circle 110 centered on U1's critical pin. A physical placement FVR 112 is generated by evaluating U5's maximum physical excursion, while its critical pin pair travels along the critical timing path boundary 110. Likewise, a second critical timing path FVR 114 is defined with respect to U3's critical pin, and a physical placement FVR 116 is likewise developed. Component U5 may now be positioned anywhere within the union of the two physical placement FVRs 112 and 116, so long as its placement does not encroach upon the physical placement violation region 120 defined by the already placed components.

Although the positioning of components U4 and U5 in the examples of FIGS. 10 and 11, were described with respect to physical placement FVRs, it will be understood that placement may be made with respect to specifically identified critical pin pairs and their associated critical timing FVRs. The physical placement FVRs (102 and 106 of FIG. 10 and 112 and 116 of FIG. 11) were chosen for convenience and ease of explanation and for the fact that representing the various constraint domains in terms of physical placement vectors allows for simplified graphical representation of a design-in-progress on a computer graphics screen. Indeed, the final design of, for example, a printed circuit board, is expressed as a physical layout of the components and interconnect wiring comprising the board. The system of the present invention is able to express the FVRs of multi-constraint domains in a consistent fashion easily adaptable to printed circuit board design. However, it will be understood by those having skill in the art that expressing FVRs in terms of physical spacing is merely exemplary and is not meant to place any limitations on the graphical expression of the system of the present invention.

An additional feature of the system and method of the present invention is its ability to associate components together in a "neighbor" relationship, when one of those components has a particular positioning requirement that depends on the positioning of the other. For example, in the preceding examples of FIGS. 10 and 11, components U1, U3, and U4 all need to be positioned within a critical timing path FVR, with U4 being the linking component between U1 and U3. Accordingly, the system of the present invention is able to designate U1, U3, and U4 as a "neighbor" group and thereby treat them as a single entity for purposes of evaluating the look-ahead feature for any follow-on component to be placed. Designating U1, U3, and U4 as a "neighbor" group results in the three components being moved together whenever any one of the three is repositioned for any reason, such as a need to free up space (create a larger FVR) for a follow-on component.

The concept of "neighbor" groups has particular implications for creating associations between other rationally related components, such as routability associations. For example, an I/O connector may have direct electrical connections to pins of a plurality of components (for example U2, U7, U12, U17, and U27 of a multi-component board). These designated components may be grouped together as "neighbors", either by a user accessible command in the software program comprising the invention, or alternatively, provided to the software system of the invention as an already-formed group as an input from a, for example, logic design software package. Once designated as "neighbors" any neighbor component is able to be location shifted, and its neighbor components will be dynamically shifted to alternative FVR regions to maintain the neighbor relationship.

Neighbor relationships can be created between any group of rationally related components. Typically a neighbor relationship is defined between components having critical timing relationships, or those sharing a particular routability concerns. A net list, conventionally generated by logic design or a CAE software program, defines the connections between various components comprising the board. From the net list the system of the present invention is able to evaluate the number of connections between components and display the interconnection relationship graphically. In addition, the system generally clarifies a number of connections between placed components by evaluating the thickness of the bundled interconnect lines between components. A first component in an, for example, ordered list is arbitrarily picked as a placement candidate and located in a generally arbitrary FVR. A next component may now be chosen solely on the basis of the greatest number of electrical connections to the first place component, and assigned a position in any FVR area which satisfies any constraints introduced by the first-placed component. As described in detail above, the actual placement of these two components will itself dynamically alter the FVR regions available for a next (third) component. In accordance with the "neighbor" concept, the first and second placed components may be assigned a neighbor relationship because of the density of the interconnect wiring disposed between them. Now, the two already-placed components may be evaluated to determine whether they have critical timing path relationships with any follow-on components or alternatively, may be used to identify a follow-on component to be placed with respect to interconnect wiring density. The above-described procedure is continued until all components from an ordered list are assigned a position on an exemplary printed circuit board. The particular resulting placement has generally a more balanced channel utilization and improved placement quality because all connections for a component are considered during placement, and rationally related components are grouped together and considered as a single unit.

A system and method for electronic system design which produces a final placement of a plurality of different electronic elements on a next level electronics package has been described. The system and method of the present invention is implemented as a computer software program and is superior to prior known element placement programs in that the final placement obtained is optimal in terms of component fit and conformance to design rules, while at the same time the final placement is efficiently obtained in terms of computer running time, even for a large number of elements. Optimal placement and computer utilization efficiency are obtained as a result of the system's ability to characterize a design space with regard to multiple constraint domains and functions to automatically and interactively replace and interconnect a multiplicity of electronic elements within heuristically determined multi-constraint free-from-violation regions.

While the system and method of the present invention has been described with regard to the placement of exemplary electronic components on an exemplary printed circuit board, it will be immediately recognized by those having skill in the art that the system and method of the present invention are equally suitable to any architectural process which requires entity placement in accordance with a characteristic set of design protocols. The techniques and methods, developed in accordance with the present invention, are applicable to the field of integrated circuit design, particularly to the layout and design of VLSI circuits comprised of "standard cell" entities. The choice and placement of "standard cells" are well known to have substantially similar constraint domains as those pertaining to printed circuit boards. For example, VLSI design requires the system architecture to accommodate physical placement constraints, thermal floor planning, critical system timing requirements, logical "neighbor" block architecture, interconnect trace routability, and the like.

Likewise, multiple chip modules (MCMs) may be designed in accordance with the system and method of the present invention, whereby the multiple constraint domain FVRs are defined with respect to the individual entities and substrates pertaining thereto. Thus, MCM design is easily accommodated by the system and method of the present invention, in a manner similar to VLSI integrated circuit design and printed circuit boards. Indeed, the system and method of the present invention is imminently suitable for computer aided design of any higher level electronic system which is constructed of a multiplicity of lower level entities, the architecture of which is limited, and defined, by a multiplicity of dissimilar constraints defining an n-dimensional constraint domain.

It will be recognized by those having skill in the art that certain of the optimization subroutines which were used at various stages of the program (e.g. design rules, net lists, auto routing, and the like) are well known techniques which have been heretofore used for element placement optimization. In the preferred embodiment, these techniques are modified and combined in accordance with practice of the principles of the invention, in order to obtain improved placements with respect to multi-constraint domains. Further, various known placement optimization techniques may be improved by incorporating the multi-constraint driven placement method and system according to the invention.

While the present invention has been particularly shown and described with reference to the exemplary embodiments thereof, it will be understood by those having skill in the art that various changes in form and detail may be made thereto without departing from the spirit and scope of the invention.

What is claimed is:

1. A system for computer aided design of a higher level electronic system which is constructed of a multiplicity of lower level entities the relative placement positions of each of which is limited by a multiplicity of dissimilar constraints defining an n-dimensional constraint domain, the system comprising:

a multiplicity of dissimilar input indicia sets, each indicia set representing a particular one of a corresponding set of dissimilar entity-to-entity layout spacing rules; and a multiplicity of design spaces, each design space defining a respective one of the multiplicity of dissimilar constraint domains and comprising violation free regions defining those areas in which an entity may be placed without violating an entity-to-entity spacing rule, each design space associated with a particular one of the multiplicity of dissimilar input indicia sets, the violation free regions of each design space constructed in accordance with the particular input indicia set associated with that design space.

2. The system of claim 1 further comprising logic means for combining violation free regions of at least two design spaces to define thereby a resulting violation free volume in which an entity may be placed without violating the entity-to-entity spacing rules of either design space.

3. The system of claim 2 wherein said violation free regions of said multiplicity of dissimilar constraint domains are iteratively combined to define thereby a resulting violation free volume in which an entity may be placed without violating the entity-to-entity spacing rules of any dissimilar constraint domain.

4. The system of claim 3 wherein said higher level electronic system is selected from the group consisting of printed circuit boards, VLSI integrated circuits and multichip modules and wherein said multiplicity of lower entities is selected from the group consisting of printed circuit board components, standard cells and module chips.

5. The system of claim 3 wherein each violation free region is adaptively reconfigured upon placement of an entity to exclude said placed entity and thereby define a next violation free volume in which a next entity may be placed.

6. A system for computer aided design of a higher level electronic system which is constructed of a multiplicity of lower level entities the relative positions of each of which is limited by a multiplicity of dissimilar constraints defining an n-dimensional constraint domain, the system comprising:

means for evaluating a first protocol set comprising a first constraint domain to thereby define first violation free regions in which an entity may be positioned;

means for evaluating a second protocol set comprising a second constraint domain unrelated to the first constraint domain to thereby define second violation free regions in which an entity may be positioned; and logic means for combining the first and second violation free regions to define thereby a resulting violation free volume in which an entity may be placed, whereby the violation free volume represents an entity placement design space within which an entity will satisfy the constraints of both the first and second constraint domains.

7. A system in accord with claim 6, wherein the first violation free region defines a range of valid position placements for an entity which satisfies the first protocol set of the first constraint domain, the first violation free region thereby mapping an available design space for the entity in that constraint domain.

8. A system in accord with claim 7, wherein the second violation free region defines a range of valid position placements for an entity which satisfies the second protocol set of the second constraint domain, the second violation free region thereby mapping an available design space for the entity in that constraint domain.

9. A system in accord with claim 8, wherein the first and second violation free regions are expressed as polygons, the areas enclosed thereby defining the range of valid position placements for an entity in the respective constraint domains.

10. A system in accord with claim 9, wherein the resulting violation free volume is expressed as polyhedra, the volume enclosed thereby defining a range of valid position placements for an entity which satisfies the constraints of both the first and second constraint domains.

11. A system in accord with claim 10, wherein each violation free region is dynamically reconfigured upon placement of an entity with respect thereto to exclude said placed entity from the range of valid position placements to thereby define a next violation free volume in which a next entity may be placed.

12. A system in accord with claim 10, wherein the first protocol set comprises physical layout design rule indicia selected from the group consisting of entity size, entity-to-entity spacing, entity height, entity orientation entity thermal dissipation and automatic insertion clearance rules.

13. A system in accord with claim 10, wherein the second protocol set comprises electrical design rule indicia selected from the group consisting of interconnect routability, interconnect channel density, interconnect delays, signal critical timing and skew, EMI emissions and signal noise.

14. A method for designing a higher level electronic system which is itself constructed of a multiplicity of lower level entities the relative positions of each of which is limited by a multiplicity of dissimilar constraints defining an n-dimensional constraint domain, the method comprising:

defining first violation free regions in which an entity may be positioned by evaluating a first protocol set comprising a first constraint domain;

defining second violation free regions in which an entity may be positioned by evaluating a second protocol set comprising a second constraint domain unrelated to the first constraint domain;

logically combining the first and second violation free regions to define thereby a resulting violation free volume in which an entity may be placed, whereby the violation free volume represents an entity placement design space within which an entity will satisfy the dissimilar constraints of both the first and second constraint domains.

15. A method in accord with claim 14, wherein the first violation free region defines a range of valid position placements for an entity which satisfies the first protocol set of the first constraint domain, the first violation free region thereby mapping an available design space for the entity in that constraint domain.

16. A method in accord with claim 15, wherein the second violation free region defines a range of valid position placements for an entity which satisfies the second protocol set of the second constraint domain, the second violation free region thereby mapping an available design space for the entity in that constraint domain.

17. A method in accord with claim 16, wherein the first and second violation free regions are expressed as polygons, the areas enclosed thereby defining the range of valid position placements for an entity in the respective constraint domains.

18. A system in accord with claim 17, wherein the resulting violation free volume is expressed as polyhedra, the volume enclosed thereby defining a range of valid position placements for an entity which satisfies the constraints of both the first and second constraint domains.

19. The method of claim 14, wherein the logical combination step includes one or more operations selected from the group consisting of logically ANDing, logically ORing, or displaying a logical union of the regions.

20. The method of claim 14, further comprising:

initializing the system by placing a first entity in an arbitrary position, the first entity in cooperation with the first protocol set of the first constraint domain defining the first violation free region in which a next entity may be positioned;

selecting a next entity to be positioned;

placing the next entity in a next position; and verifying that the next entity placement position is in the first violation free region, whereby the violation free region is dynamically altered by the placement of the next entity.

* * * * *